US007710165B2

(12) United States Patent
Bi

(10) Patent No.: US 7,710,165 B2
(45) Date of Patent: May 4, 2010

(54) VOLTAGE-TO-CURRENT CONVERTER

(75) Inventor: Han Bi, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/904,225

(22) Filed: Sep. 25, 2007

(65) Prior Publication Data

US 2009/0079470 A1 Mar. 26, 2009

(51) Int. Cl.
*H03F 3/45* (2006.01)

(52) U.S. Cl. ...................................... 327/103; 327/378

(58) Field of Classification Search ....................... None
See application file for complete search history.

(56) References Cited

U.S. PATENT DOCUMENTS 5,200,655 A * 4/1993 Feldt .......................... 327/346
5,231,315 A * 7/1993 Thelen, Jr. .................. 327/103
6,693,467 B2 * 2/2004 Marie ......................... 327/103
7,109,785 B2 * 9/2006 Derksen ..................... 327/543
2003/0169094 A1 * 9/2003 Zhang et al. ................ 327/513

* cited by examiner

*Primary Examiner*—Cassandra Cox
(74) *Attorney, Agent, or Firm*—Haynes and Boone LLP

(57) ABSTRACT

A Voltage-to-Current converter includes a current mirror having first and second poles, a first transistor coupled between the first pole of the current mirror and a low voltage through a first resistor, a second transistor coupled between the second pole of the current mirror and a low voltage through a second resistor wherein the second resistor is substantially identical with the first resistor, and wherein the output current is dependent on resistance of the first resistor, the input voltage signal applied to the gate of the first transistor, and a reference voltage signal applied to the gate of the second resistor.

4 Claims, 3 Drawing Sheets

VOLTAGE-TO-CURRENT CONVERTER

DESCRIPTION OF THE INVENTION

1. Field of the Invention

The present invention relates to a Voltage-to-Current converter, more particularly to a Voltage-to-Current converter utilizing MOS devices.

2. Background of the Invention

A Voltage-to-Current converter is well known as a device converting a voltage signal to a current signal, and used, for example, in Phase-Locked-Loops (PLL), adaptive filters, multipliers, dividers, squaring circuits, integrators, Analog-to-Digital converters, and other applications in which a current signal is required. For example, a PLL typically includes a Voltage Controlled Oscillator (VCO) that inputs a control voltage signal from a loop filter. The control voltage is typically converted to a current signal in a Voltage-to-Current converter and the current is utilized to accurately control the oscillator. The VCO can therefore provide a signal at a frequency adjusted by a phase error signal generated in the loop filter.

However, conventional Voltage-to-Current converters are temperature sensitive. Although a bias current can be utilized to adjust the output current of the voltage-to-current converter, the output current of the voltage-to-current converter may drift with temperature.

Therefore, there is a need for voltage-to-current converters where the effects of temperature are substantially reduced or eliminated.

SUMMARY OF THE INVENTION

In accordance with embodiments of the present invention, a Voltage-to-Current converter for converting an input voltage signal to an output current signal that may be substantially independent of operating temperature is presented. A Voltage-to-Current converter according to some embodiments of the present invention includes a temperature compensation circuit that compensates for the temperature sensitivity of the remainder of the Voltage-to-Current converter.

In some embodiments of the invention, a Voltage-to-Current converter includes a current mirror having first and second poles, a first transistor coupled between the first pole of the current mirror and a low voltage through a first resistor, a second transistor coupled between the second pole of the current mirror and a low voltage through a second resistor wherein the second resistor is substantially identical with the first resistor, and wherein the output current is dependent on the resistance of the first resistor, the input voltage signal applied to the gate of the first transistor, and a reference voltage signal applied to the gate of the second transistor.

Some embodiments of the present invention improve temperature-insensitivity of the Voltage-to-Current converter. Furthermore, some embodiments of the present invention provide the Voltage-to-Current converter with insensitivity to transistor process variation, which is also a desirable feature.

These and other embodiments will be described in further detail below with respect to the following figures.

Figure 1:
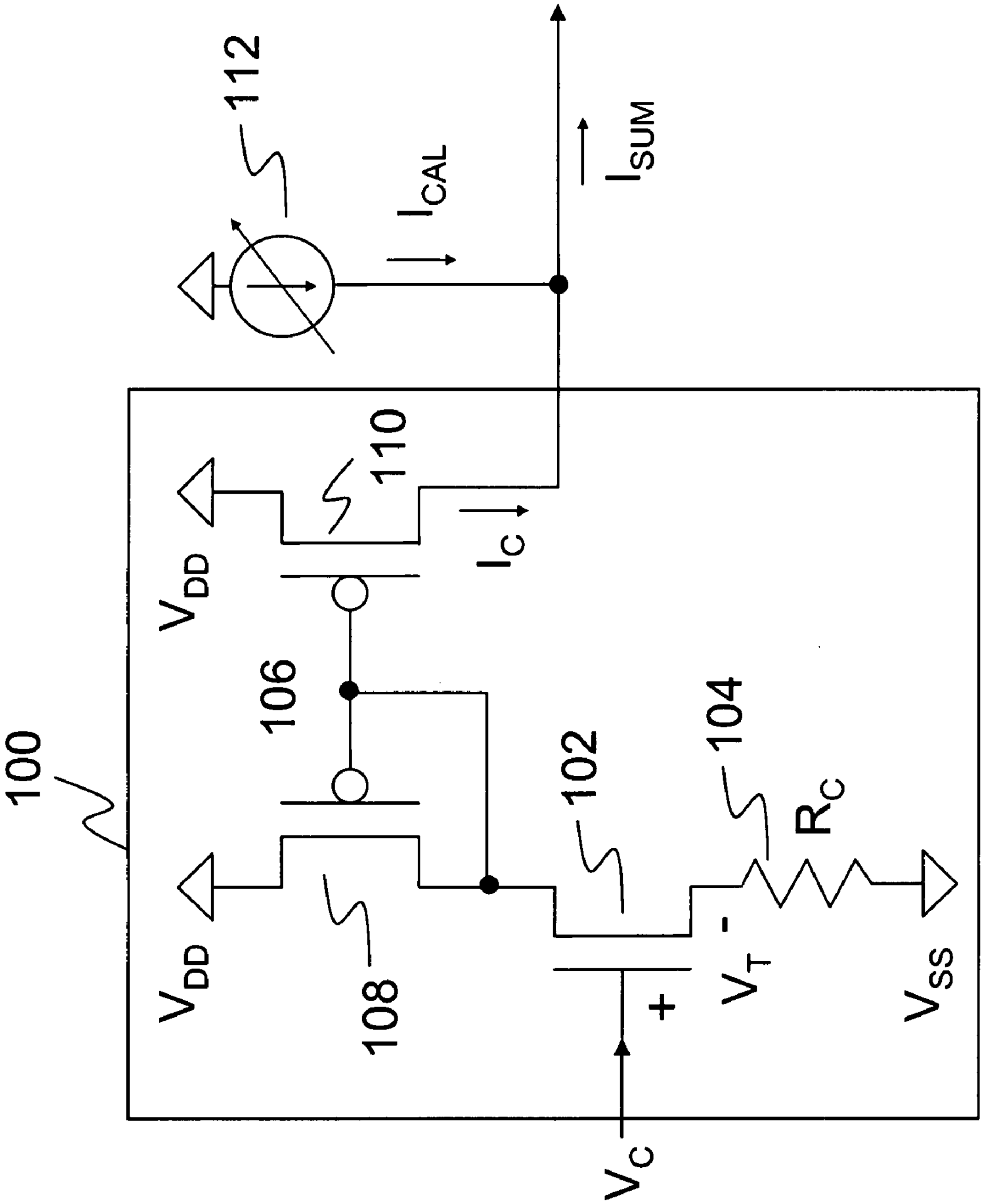
Figure 1 (Prior Art)
FIG. 1 shows a circuit diagram of a conventional Voltage-to-Current converter.

In the drawings, elements having the same designation have the same or similar functions.

DESCRIPTION OF THE EMBODIMENTS

In the following description specific details are set forth, such as specific materials, process and equipment, in order to provide a thorough understanding of the present invention. It will be apparent, however, to one skilled in the art that the present invention may be practiced without these specific details. In other examples, well-known manufacturing materials, processes and equipment are not set forth in detail in order to not unnecessarily obscure the description of embodiments of the present invention.

FIG. 1 illustrates a Voltage-to-Current converter 100. The Voltage-to-Current converter 100 is configured with a single-ended circuit to convert an input voltage ($V_C$) into an output current ($I_C$). As illustrated in FIG. 1, Voltage-to-Current converter 100 includes a current mirror 106 with P-Channel Metal Oxide Semiconductor (PMOS) transistors 108 and 110. The gates of PMOS transistors 108 and 110 are coupled to each other and to the source of PMOS transistor 108 (by convention, the source of a MOS transistor is generally designated as the low voltage side and the drain is designated as the high-voltage side). The drains of PMOS transistors 108 and 110 are both coupled to power $V_{DD}$. The source of PMOS transistor 108 is input to the drain of N-Channel Metal Oxide Semiconductor (NMOS) transistor 102. The source of NMOS transistor 102 is coupled to ground through resistor 104. The input voltage $V_C$ is coupled to the gate of NMOS transistor 102. Typically, a calibration current ($I_{CAL}$) is generated by a calibration current source 112 to offset the output current ($I_C$), which is the source of PMOS transistor 110.

Functionally, a voltage supplied to the gate of NMOS transistor 102 pulls current through transistor 108 and resistor 104 that is related to the strength of that voltage. PMOS transistor 110 mirrors the current to provide an output current at the source of PMOS transistor 110. This output current ($I_C$) is given by the following equation:

$$I_C=(V_C-V_T)/R_C \quad (1)$$

As shown in Equation (1), the output current ($I_C$) depends on the control voltage ($V_C$) supplied to the gate of NMOS transistor 102, the conversion resistance ($R_C$) of resistor 104, and the threshold voltage ($V_T$). The threshold voltage ($V_T$) approximately equals to the threshold voltage of $V_T$ of NMOS transistor 102.

However, the threshold voltage ($V_T$) is variable depending on temperature. Therefore, the temperature effects the output current ($I_C$). When the Voltage-to-Current converter is applied to the PLL integrated with a calibration function, the temperature changes in the output current ($I_C$) adversely affects the PLL performance.

The calibration function of the PLL serves to decrease a gain of the VCO ($K_{VCO}$). Instead of directly utilizing the current transmitted from the Voltage-to-Current converter, the PLL adds a current ($I_{CAL}$), which is generated by calibration current source 112, to the output current ($I_C$), generating a total output current ($I_{SUM}$). Then, the PLL utilizes the total output current ($I_{SUM}$) to control the oscillator.

In a calibration stage, calibration current source 112 may be adjusted so that the average control voltage ($V_C$) may be set at the mid-point of a tuning range of the VCO. A state-machine adjusts the current $I_{CAL}$ until the total output current ($I_{SUM}$) becomes a proper level required for the VCO to generate the proper signal. Once the calibration is accomplished, the state-machine is released from controlling the control voltage ($V_C$) and the control voltage becomes the output signal from the loop filter of a PLL loop.

If the PLL is calibrated at a lower temperature and afterwards operates at a higher temperature, the output current ($I_C$) is increased as a result of the higher temperature, according to Equation (1) because the threshold voltage ($V_T$) becomes smaller at the higher temperature. In order that the output current ($I_C$) is the same level at the lower temperature, the control voltage ($V_C$) needs to decrease so as to compensate for the change of $V_T$. However, the control voltage $V_C$ is originally set in the mid-point of the tuning range. Therefore, when the $V_C$ decreases, the tuning range also decreases.

The Voltage-to-Current converter can be utilized in devices other than PLLs. As discussed, Voltage-to-Current converters are also utilized in adaptive filters, multipliers, dividers, squaring circuits, integrators, analog-to-digital converters, and other applications in which a current signal is required. The temperature dependence of converter 100 also poses instabilities and other difficulties for the operation of these applications.

Figure 2:
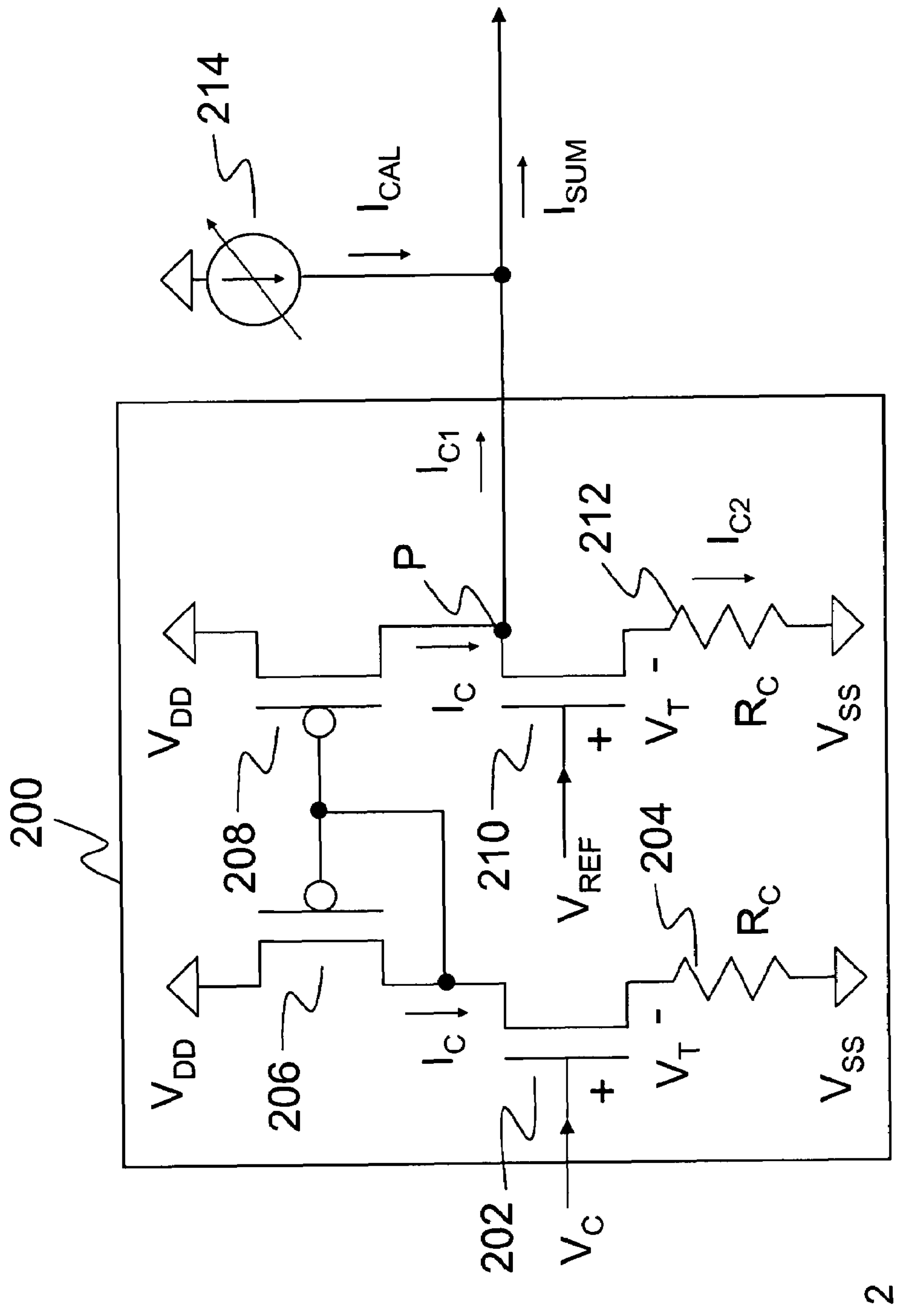
FIG. 2 shows a circuit diagram of a Voltage-to-Current converter according to some embodiments of the present invention.

FIG. 2 illustrates an embodiment of a Current-to-Voltage converter 200 according to some embodiments of the present invention. Voltage-to-Current converter 200 converts an input voltage $V_C$ into an output current $I_{C1}$.

As shown in FIG. 2, Current-to-Voltage converter 200 includes a current mirror formed of PMOS transistors 206 and 208. As shown, the drains of PMOS transistors 206 and 208 are both coupled to voltage $V_{DD}$. The gates of PMOS transistors 206 and 208 are both coupled to the source of PMOS transistor 206. The source of PMOS transistor 206 is coupled to the drain of NMOS transistor 202. The source of NMOS transistor 202 is coupled through resistor 204, having resistance $R_C$, to low voltage $V_{SS}$, which may be ground. The gate of transistor 202 is coupled to receive the input voltage $V_C$.

The source of PMOS transistor 208, which provides the output current $I_{C1}$, is coupled to the drain of NMOS transistor 210. The source of NMOS transistor 210 is coupled through resistor 212, which has a resistance $R_C$, to ground. The gate of NMOS transistor 210 is coupled to receive a reference voltage $V_{REF}$.

The output current $I_{C1}$ may be summed with a calibration current $I_{CAL}$ to provide the current $I_{SUM}$. Calibration current $I_{CAL}$ can be generated by a calibration current source 214.

The input voltage $V_C$ is supplied to the gate of NMOS transistor 202, which is coupled to resistor 204 at its source side and coupled to the source of P-channel MOS (PMOS) 206. NMOS transistor 202 has threshold voltage $V_T$ and therefore draws current through PMOS transistor 206 and resistance 204 in response to an input voltage $V_C$ in accordance with Equation 1.

Resistor 204 reduces noise and jitter sensitivity of the Voltage-to-Current converter 200. Resistor 204 may be provided together with the NMOS transistor 202 in a substrate.

When the input voltage signal $V_C$, which exceeds the threshold voltage $V_T$, is applied to a gate side of the NMOS transistor 202, the NMOS transistor 202 transfers the drain-to-source current $I_C$. The drain-to-source current $I_C$ increases in response to the gate bias of the NMOS transistor 202. Preferably, the drain-to-source current $I_C$ in saturation increases linearly with the gate bias. When it is assumed that the drain-to-source resistance of the NMOS transistor 202 becomes negligible in comparison to the resistance $R_C$ of the resistor 204, the drain-to-source current $I_C$ is substantially in accordance with the following simplified first-order linear equations:

$$I_C=0 \quad V_C \leqq V_T \tag{2}$$

$$I_C=(V_C-V_T)/R_C \quad V_C \geqq V_T \tag{3}$$

As shown in Equations 2 and 3, when the input voltage $V_C$ increases beyond the threshold voltage $V_T$, the drain-to-source current $I_C$ linearly increases in accordance with the input voltage $V_C$.

As shown in FIG. 2, PMOS transistor 206 is coupled to PMOS transistor 208 and transfers current signal supplied to the drain of NMOS transistor 202. PMOS transistor 206 and PMOS transistor 208 are coupled together at both gates and configured to operate as a part of a current mirror circuit. A current mirror circuit is configured to copy a current, keeping an output current at the source of PMOS transistor 208 the same as the current at the source of PMOS transistor 206 regardless of loading. Therefore, PMOS transistor 208 copies the drain-to-source current $I_C$ of PMOS transistor 206, transferring a current signal which has the same current level as the drain-to-source $I_C$. Accordingly, the PMOS 208 transmits the current $I_C$ in accordance with the input voltage $V_C$, as the above-mentioned Equations (2) and (3). In the example shown in FIG. 2, the current mirror circuit includes PMOS transistors. However, any type of a current mirror circuit and a transistor is applicable to the present invention for transferring the current $I_C$ in accordance with the input voltage $V_C$. Other examples of current mirror circuits utilize Bipolar Junction Transistors or NMOS transistors.

As shown in FIG. 2, the drain of NMOS transistor 210 is coupled to the source of PMOS transistor 208, receiving the current signal from PMOS transistor 208. The source of NMOS transistor 210 is coupled to low voltage $V_{SS}$ through resistor 212. NMOS transistor 210 also has a threshold voltage $V_T$, which is approximately equal to the threshold voltage of NMOS transistor 202.

The NMOS transistor 210 receives reference voltage $V_{REF}$ as an adjusting voltage signal. The reference voltage $V_{REF}$ is supplied to the gate of NMOS transistor 210. NMOS transistor 210 transfers drain-to-source current $I_{C2}$ from the drain side to the source side in accordance with a level of the reference voltage $V_{REF}$, as indicated in Equation 1.

As shown in FIG. 2, an output node P is provided between the PMOS transistor 208 and the NMOS transistor 210, receiving the current signal from the PMOS transistor 208. The mirrored current $I_C$ is directed between the output current $I_{C1}$ and the current through NMOS transistor 210.

Resistor 212 is coupled between the source of NMOS transistor 210 and lower voltage side $V_{SS}$, such as a grounding side, and has resistance $R_C$ approximately equal to the resistance of the resistor 204. Resistor 212 may be provided together with the NMOS transistor 210 in a substrate.

Figure 3:
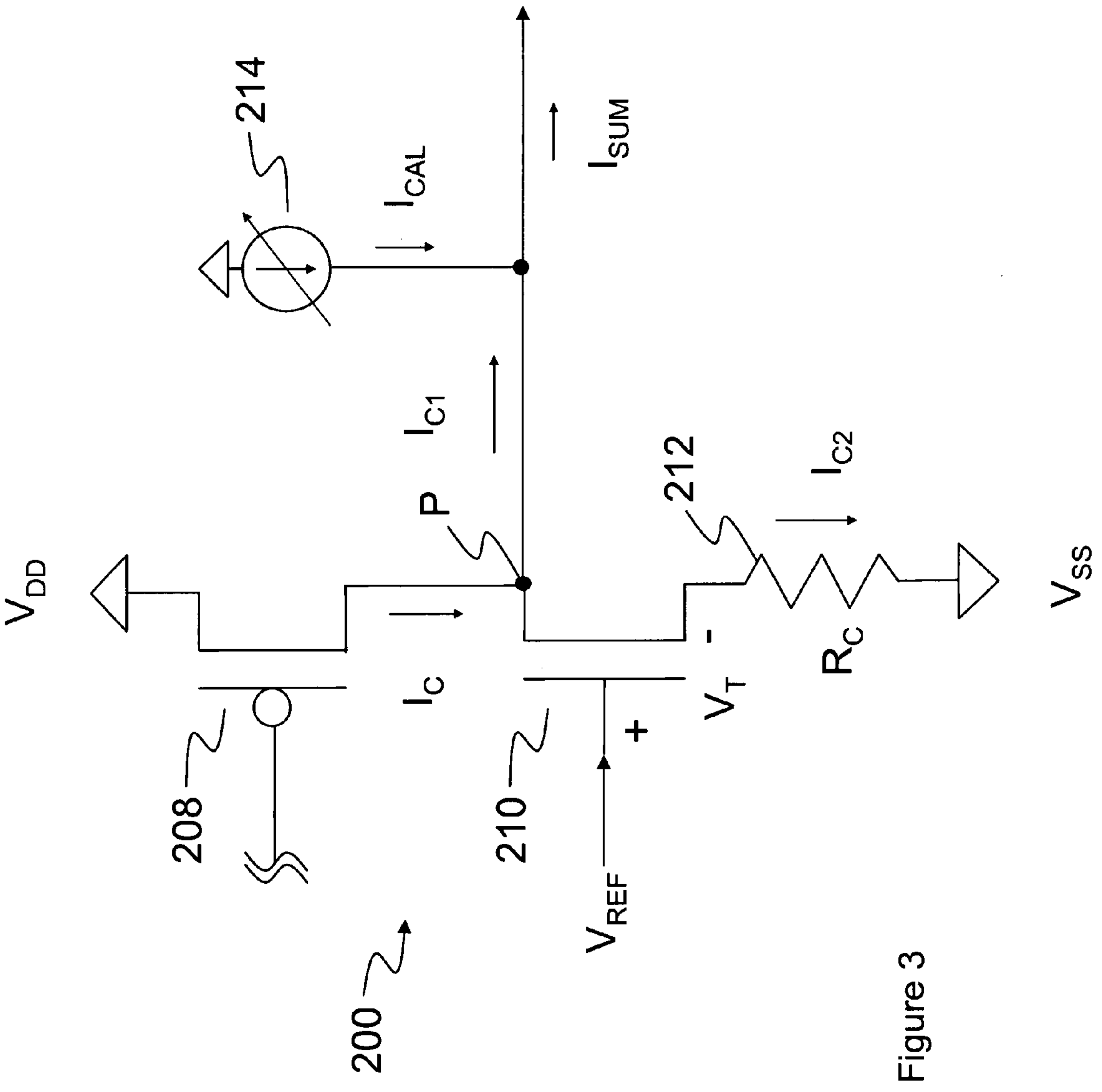
FIG. 3 shows a circuit diagram of a part of a Voltage-to-Current converter according to some embodiments of the present invention.

FIG. 3 illustrates the part of the circuit diagram shown in FIG. 2 that includes PMOS transistor 208 and NMOS transistor 210. The current $I_C$ from the PMOS transistor 208 divides into the output current $I_{C1}$ and the drain-to-source current $I_{C2}$ at node P. Thus, the relationship between these currents is represented by the following equation:

$$I_C=I_{C1}+I_{C2} \tag{4}$$

Therefore, according to Equations (3) and (4), the output current $I_{C1}$ is defined by the following equation:

$$I_{C1}=I_C-I_{C2}=(V_C-V_T)/R_C-I_{C2} \tag{5}$$

When the reference voltage signal $V_{REF}$, which exceeds the threshold voltage $V_T$, is applied to the gate side of the NMOS transistor 210, the NMOS transistor 210 transfers the drain-to-source current $I_{C2}$. The drain-to-source current $I_{C2}$ increases in response of gate bias of the NMOS transistor 210. Preferably, the drain-to-source current $I_{C2}$ in saturation increases linearly with the gate bias. When it is assumed that drain-to-source resistance of the NMOS transistor 210 becomes negligible in comparison to the resistance $R_C$ of the resistor 212, the drain-to-source current $I_{C2}$ is substantially in accordance with the following simplified first-order linear equations:

$$I_{C2}=0 \quad V_{REF}\leqq V_T \tag{6}$$

$$I_{C2}=(V_{REF}-V_T)/R_C \quad V_{REF}\geqq V_T \tag{7}$$

When the input voltage $V_{REF}$ increases beyond the threshold voltage $V_T$, the drain-to-source current $I_{C2}$ linearly increases in accordance with the input voltage $V_{REF}$.

According to Equations (5) and (7), the output current $I_{C1}$ is defined by the following equation:

$$I_{C1}=(V_C-V_T)/R_C-(V_{REF}-V_T)/R_C=(V_C-V_{REF})/R_C \tag{8}$$

In accordance with Equation (8), the output current $I_{C1}$ is represented by the input voltage $V_C$, the reference voltage $V_{REF}$ and the resistance value $R_C$. The output current $I_{C1}$ does not depend on the threshold voltage $V_T$, which is variable depending on temperature. Therefore, Voltage-to-Current converter 200 is able to stably transmit the output current $I_{C1}$ as a function of input voltage $V_C$ independently of the temperature changes of the circuit.

The temperature-stable output current $I_{C1}$ is supplied from the Voltage-to-Current converter 200 and added with a current $I_{CAL}$ from a variable-type constant current source 214. Consequently, a total output current $I_{SUM}$ is stable with temperature, which can well be used controlling the oscillator.

By providing a pseudo-differential configuration, such as the NMOS transistor 210 and the resistor 212, the present invention improves temperature-insensitivity of the Voltage-to-Current converter.

For illustrative purposes, embodiments of the invention have been specifically described above. This disclosure is not intended to be limiting. Therefore, the invention is limited only by the following claims.

What is claimed is:

1. A Voltage-to-Current converter for converting an input voltage signal to an output current signal, the Voltage-to-Current converter comprising:

a current mirror having first and second poles;

a first transistor coupled between the first pole of the current mirror and a low voltage through a first resistor;

a second transistor coupled between the second pole of the current mirror and a low voltage through a second resistor wherein the second resistor is substantially identical with the first resistor;

wherein the output current is dependent on resistance of the first resistor, the input voltage signal applied to the gate of the first transistor, and a reference voltage signal applied to the gate of the second transistor; and further wherein the output current is independent of the threshold voltage of the first and second transistors.

2. The Voltage-to-Current converter according to claim 1, wherein the first transistor and the second transistor are MOS transistors.

3. The Voltage-to-Current converter according to claim 1, wherein the first transistor has a threshold voltage that is approximately equal to a threshold voltage of the second transistor.

4. A Voltage-to-Current converter for converting an input voltage signal to an output current signal, the Voltage-to-Current converter comprising:

a current mirror having first and second poles;

a first transistor coupled between the first pole of the current mirror and a low voltage through a first resistor;

a second transistor coupled between the second pole of the current mirror and a low voltage through a second resistor wherein the second resistor is substantially identical with the first resistor;

wherein the output current is dependent on resistance of the first resistor, the input voltage signal applied to the gate of the first transistor, and a reference voltage signal applied to the gate of the second transistor; wherein the output current is independent of the threshold voltage of the first and second transistors; and further wherein the current mirror comprises a third transistor with source and drain coupled between a high voltage and the first pole; and a fourth transistor with source and drain coupled between a high voltage and the second pole and gate coupled to the gate of the third transistor and the first pole.

* * * * *